(12) United States Patent
Chen et al.

(10) Patent No.: US 10,863,649 B2
(45) Date of Patent: Dec. 8, 2020

(54) AIR GENERATING SYSTEM FOR RESERVOIR TANK, IMMERSION COOLING APPARATUS HAVING THE SAME, AND METHOD FOR OPERATING THE SAME

(71) Applicant: Wistron Corp., New Taipei (TW)

(72) Inventors: Hua Chen, New Taipei (TW); Sheng Yen Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/451,241

(22) Filed: Jun. 25, 2019

(65) Prior Publication Data

US 2020/0315060 A1 Oct. 1, 2020

(30) Foreign Application Priority Data

Mar. 26, 2019 (TW) .............................. 108110523 A

(51) Int. Cl.
*H05K 7/20* (2006.01)
*G06F 1/20* (2006.01)

(52) U.S. Cl.
CPC .......... *H05K 7/20236* (2013.01); *G06F 1/20* (2013.01); *H05K 7/20781* (2013.01); *G06F 2200/201* (2013.01)

(58) Field of Classification Search
CPC . G06F 1/20; G06F 2200/201; H05K 7/20236; H05K 7/20781
See application file for complete search history.

(56) References Cited

U.S. PATENT DOCUMENTS

| 2013/0019614 A1* | 1/2013 | Campbell | H05K 7/20136 |
| | | | 62/62 |
| 2016/0330865 A1* | 11/2016 | Mathew | H05K 7/20236 |
| 2017/0112017 A1* | 4/2017 | Wang | F28D 15/02 |
| 2017/0295670 A1* | 10/2017 | Campbell | H05K 5/06 |
| 2017/0303434 A1* | 10/2017 | Katsumata | H01L 23/44 |
| 2018/0084670 A1* | 3/2018 | Hirai | H05K 7/20272 |
| 2018/0279507 A1* | 9/2018 | Midgley | H05K 7/20236 |
| 2018/0338388 A1* | 11/2018 | Wei | H05K 7/20781 |
| 2018/0343770 A1* | 11/2018 | Brink | H05K 7/20245 |

FOREIGN PATENT DOCUMENTS

CN 104597994 B 8/2018

OTHER PUBLICATIONS

Intellectual Property Office Ministry of Economic Affairs, R.O.C., "Taiwan Office Action and Search Report for TW Appln No. 108110523", Taiwan, Nov. 12, 2019.

* cited by examiner

*Primary Examiner* — Jacob R Crum
(74) *Attorney, Agent, or Firm* — Locke Lord LLP; Tim Tingkang Xia, Esq.

(57) ABSTRACT

The disclosure relates to an air generating system for reservoir tank, an immersion cooling apparatus having the same and a method for operating the same. The air generating system is adapted for a reservoir tank. The reservoir tank has a liquid accommodation space and an opening connected to each other. The air generating system includes a first air generating assembly configured to be disposed on the reservoir tank and to generate an airflow distribution at the opening or between the opening and the liquid accommodation space.

16 Claims, 7 Drawing Sheets

AIR GENERATING SYSTEM FOR RESERVOIR TANK, IMMERSION COOLING APPARATUS HAVING THE SAME, AND METHOD FOR OPERATING THE SAME

CROSS-REFERENCE TO RELATED APPLICATIONS

This non-provisional application claims priority under 35 U.S.C. § 119(a) on Patent Application No(s). 108110523 filed in R.O.C Taiwan on Mar. 26, 2019, the entire contents of which are hereby incorporated by reference.

TECHNICAL FIELD

The disclosure relates to an air generating system for a reservoir tank, more particularly to an air generating system for a reservoir tank, an immersion cooling apparatus having the same, and a method for operating the same.

BACKGROUND

With the rapid growth of technology, especially in the ear of increased demand for internet, artificial intelligence, and cloud services, data centers need to process more and more data in order to maintain or upgrade the processing efficiency. It is necessary to continuously and effectively dissipate the data centers. Due to the high power density of the data centers and a large amount of heat generated by the data centers, the traditional heat dissipation device is required to be constantly operated in high power mode or should upgrade its scale, leading to disadvantages, such as high energy consumption, increasing cost, and impact on the environment.

Therefore, in recent years, liquid-cooling technologies such as immersion cooling get more attention. The immersion cooling not only can effectively cool the data center and greatly reduce energy consumption and cost but also can effectively reduce the overall size of the data center. Specifically, the immersion cooling technology is to immerse the heat source of the data center, such as the mainboard and the electronic components thereon, in a non-conductive coolant so that the heat generated can be directly and quickly transmitted to the coolant, and there is no need to set additional active cooling device, such as a fan, to enhance the heat dissipation efficiency, and which gives the data center more room to accommodate more hardware.

Generally, when the data center is in normal operation, the coolant is continuously heated and vaporized. The conventional immersion cooling apparatus may contain a vapor condenser to condense the vaporized coolant and turn it back to liquid state so as to recycle the coolant, but there is no specific means to collect the vaporized coolant. Therefore, when the lid of the immersion cooling apparatus is opened during the maintenance process, removal, or installation of the internal electronic components, there will be a large amount of vaporized coolant escaping from the opening of the immersion cooling apparatus. As a result, it needs to regularly replenish the coolant and that leads to a considerable maintenance cost. In addition, the vaporized coolant that escapes into the air can also cause harm to the environment and the human body. Even if the data center stops running and not generating heat, the coolant still will naturally evaporate and thus resulting in the coolant escaping.

Some try to increase the height of the coolant tank to make the coolant difficult to escape, but it is not a practical solution and wasting space. Therefore, how to prevent the coolant from escaping is one of the most important topics in this field.

SUMMARY

The present disclosure provides an air generating system for reservoir tank, an immersion cooling apparatus having the same, and a method for operating the same, which are able to prevent the vaporized coolant from escaping.

One embodiment of the disclosure provides an air generating system adapted for a reservoir tank. The reservoir tank has a liquid accommodation space and an opening connected to each other. The air generating system includes a first air generating assembly configured to be disposed on the reservoir tank and to generate an airflow distribution at the opening or between the opening and the liquid accommodation space.

One embodiment of the disclosure provides an immersion cooling apparatus including a reservoir tank and a first air generating assembly. The reservoir tank has a liquid accommodation space and an opening connected to each other. The first air generating assembly is located on the reservoir tank and configured to generate an airflow distribution at the opening or between the opening and the liquid accommodation space.

One embodiment of the disclosure provides a method for operating an air generating system with a reservoir tank. The method includes: activating a first air generating assembly to generate an airflow distribution at an opening of the reservoir tank or between the opening and a liquid accommodation space of the reservoir tank.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
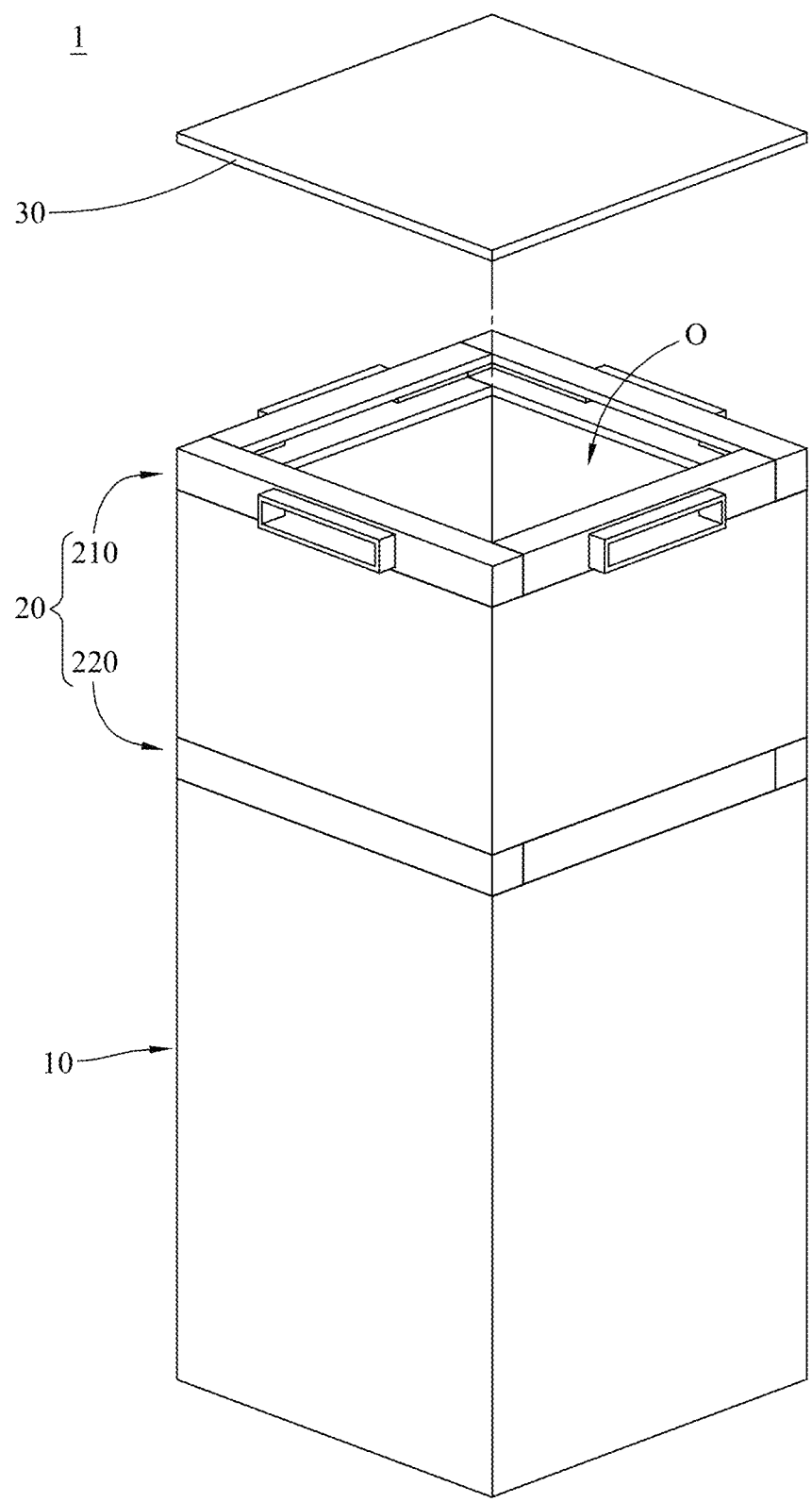
FIG. 1 is a perspective view of an immersion cooling apparatus according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the drawings, and for the purpose of illustration, some of the features in the drawings may be simplified and exaggerated, but the present disclosure is not limited thereto.

Further, the terms, such as "end", "portion", "part", "area" and the like may be used in the following to describe specific components and structures or specific features thereon or therebetween, but are not intended to limit these components and structures. And the followings may use terms, such as "substantially", "approximately", or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Figure 2:
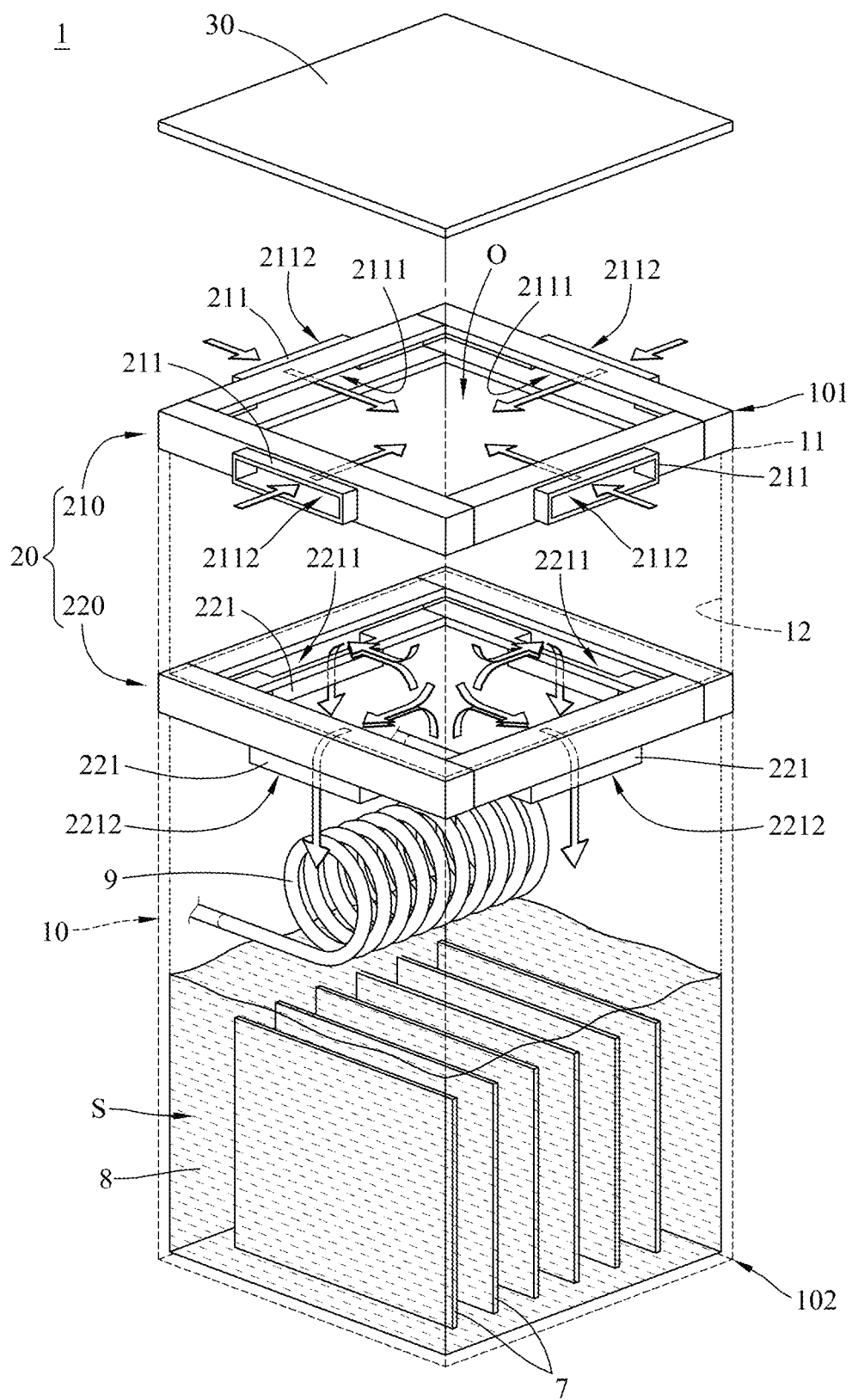
FIG. 2 shows an interior arrangement of the immersion cooling apparatus in FIG. 1.

Firstly, please refer to FIGS. 1-2, where FIG. 1 is a perspective view of an immersion cooling apparatus according to one embodiment of the disclosure, and FIG. 2 shows an interior arrangement of the immersion cooling apparatus in FIG. 1. Some components in FIG. 2 are illustrated in dotted line for better clarity of description herein. In this embodiment or some other embodiments, an immersion cooling apparatus 1 includes a reservoir tank 10 (can be simply called "tank") and an air generating system 20. The air generating system 20 is able to generate an airflow distribution (not shown in FIGS. 1-2) for preventing vapor coolant in the reservoir tank 10 from escaping to the external environment.

In addition, as shown in the figure, in this embodiment or some other embodiments, the immersion cooling apparatus 1 may further include a lid 30. The lid 30 is movably or removably disposed on the reservoir tank 10 and is able to open or close the opening of the reservoir tank 10. When the lid 30 is opened during the operation of the air generating system 20, the airflow distribution generated by the air generating system 20 is still able to prevent vapor coolant in the reservoir tank 10 from escaping.

The followings are to introduce the detail of the reservoir tank 10 and the air generating system 20 so as to specifically explain how to prevent the vapor coolant from escaping.

In this embodiment, the reservoir tank 10 is a hollow container and opened at one side, and it is not limited to be square-shaped or rectangular-shaped. Note that the disclosure is not limited to the shape, size, wall thickness, and material of the reservoir tank 10. As shown in the figures, in this embodiment and some other embodiments, the reservoir tank 10 has a liquid accommodation space S and an opening O that are connected to each other. In this embodiment and some other embodiments, said liquid accommodation space S is part of the internal space (not numbered) of the reservoir tank 10, especially the internal area in the reservoir tank 10 for accommodating liquid coolant 8 and/or one or more heat sources 7; and said opening O is for the internal space of the reservoir tank 10 to connect to outside. The opening O is sized to allow the heat source 7 to pass therethrough so that the heat source 7 can be taken out from or put into the reservoir tank 10 via the opening O, but the disclosure is not limited thereto.

Further, in this embodiment or some other embodiments, the reservoir tank 10 has a top side 101 and a bottom side 102.

The top side 101 is the side of the reservoir tank 10 where the opening O is formed; that is, the opening O is formed at the top side 101 of the reservoir tank 10. The bottom side 102 is opposite the top side 101, and the bottom side 102 is the side of the reservoir tank 10 used to be in contact with a table or ground. As shown in the figures, the liquid accommodation space S is an internal area of the reservoir tank 10 relatively close to the bottom side 102 of the reservoir tank 10.

In addition, the aforementioned heat source 7 may be, but not limited to, one or more mainboards and/or other electronic/electrical components or devices, and the disclosure is not limited to the heat source 7, the type, quantity, and size of the heat source 7, and/or the components disposed on the heat source 7; and the aforementioned liquid coolant 8 may be, but not limited to, a liquid substance, that has some characteristics suitable for immersion cooling application, such as low boiling point, high heat-transfer efficiency, high thermal capacity and not electrically conductive (dielectric). That is, in this disclosure, the liquid coolant 8 is an electrical insulator. The "low boiling point" herein may be set between approximately 40 and 60 degrees Celsius or at least below the temperature of the heat source 7 in operation. Therefore, the liquid coolant 8 is a heat transfer fluid that is adaptive to be in direct contact with the heat source 7 so as to absorb the heat generated by the heat source 7. The liquid coolant 8 can either keep its liquid phase or become gaseous, or can undergo a phase transition between liquid and gas, but the disclosure is not limited to the liquid coolant 8, and the type, phase transition, and/or physical characteristics of the liquid coolant 8.

Further, to effectively dissipate heat generated by the heat source 7, the heat source 7 can be partially or fully immersed in the liquid coolant 8. In most cases, the temperature of the heat source 7 in operation is higher than the boiling point of the liquid coolant 8 so that the heat generated by the heat source 7 can vaporize the liquid coolant 8 into vapor substance (i.e., vapor coolant or vaporized coolant, but not shown in FIGS. 1-2), and then the vapor coolant will rise toward the opening O.

In this embodiment or some other embodiments, the air generating system 20 is configured to prevent the vapor coolant from escaping to the external environment from the opening O of the reservoir tank 10. In detail, in this embodiment or some other embodiments, the air generating system 20 may include a first air generating assembly 210, the first air generating assembly 210 may be additionally disposed on or integrally formed on the reservoir tank 10, but the disclosure is not limited thereto. As shown in the figures, the first air generating assembly 210 may be arranged between the liquid accommodation space S and the lid 30 and is configured to generate an airflow distribution at the opening O or at the area between the opening O and the liquid accommodation space S.

In more detail, as shown in the figures, the first air generating assembly 210 may be, but not limited to, located at the opening O of the reservoir tank 10. In the case that the first air generating assembly 210 is additionally disposed on the reservoir tank 10, the first air generating assembly 210 is stacked on the top surface 11 of the reservoir tank 10 by, for example, screwing, welding, or adhesive.

In addition, the first air generating assembly 210 has at least one first air outlet 2111. The first air outlet 2111 is connected to the liquid accommodation space S and located at a side of the first air generating assembly 210 facing toward the liquid accommodation space S, and the first air outlet 2111 may be, but not limited to, located at the opening O. In this embodiment, the first air generating assembly 210 can generate airflow (indicated by the arrows) inward from the first air outlet 2111 so as to form an airflow distribution. The said airflow distribution can be considered as an air barrier, air wall, or air curtain that is able to block vapor coolant from flowing between the internal space of the reservoir tank 10 and the external environment. It is understood that the airflow distribution can block the internal vapor and gaseous substance, such as the gaseous and/or vapor coolant and/or other internal gas, from flowing between the internal space of the reservoir tank 10 and the external environment. Note that the physical characteristics of the airflow distribution such as size, density, flow velocity are not restricted and can be altered as long as they're able to block the vapor coolant and/or other internal gas from escaping from the reservoir tank 10.

In this embodiment or some other embodiments, the first air generating assembly 210 may have four first air outlets 2111 that are respectively located at four sidewalls (not numbered) of the reservoir tank 10; in other words, the first air outlets 2111 are respectively located at different sides of the reservoir tank 10. In such an arrangement, the first air outlets 2111 on the opposite sides of the reservoir tank 10 may able to generate airflow in opposite directions, as indicated by the arrows, the airflow generated from the first air outlets 2111 in opposite sides of the reservoir tank 10 flows toward each other. Therefore, in this embodiment, the four first air outlets 2111 on the four sidewalls of the reservoir tank 10 can generate airflow toward the central area of the reservoir tank 10 and thus together forming an airflow distribution at the opening O or in somewhere between the opening O and the liquid accommodation space S, thereby preventing the vapor coolant or other internal gas from escaping from the opening O.

In addition, in this embodiment or some other embodiments, the first air outlets 2111 of the reservoir tank 10 may be substantially located at the same height; in other words, the distances from the bottom side 102 to each of the first air outlets 2111 may be the same, which helps the first air generating assembly 210 to generate a steady airflow distribution.

Note that the disclosure is not limited to the direction of the airflow generated from the first air outlets 2111 of the first air generating assembly 210, and the direction of the airflow generated from the first air outlets 2111 is not restricted to the embodiment shown herein but can be altered to be horizontal or inclined downward depending on the actual requirements.

Note that the disclosure is not limited to the quantity and location of the first air outlets 2111, any arrangement or design of the first air outlets 2111, that can create an airflow distribution in the area (ullage space) above the liquid accommodation space S to prevent the vapor coolant or other internal gas from passing through the opening O, should fall within the scope of the disclosure. For example, in some other embodiments, the first air generating assembly may only have two first air outlets respectively located on two opposite sides of the reservoir tank; alternatively, in another embodiment, each side of the reservoir tank may have two first air outlets; or, in further another embodiment, the first air outlet may be a single continuous annular air outlet that is formed on the sidewalls of the reservoir tank.

Also, it is noted that the disclosure is not limited to how the first air generating assembly 210 generates airflow from the first air outlets 2111. In this embodiment or some other embodiments, the first air generating assembly 210 may include one or more first airflow generators 211, and each of the first airflow generators 211 may be, but not limited to, a cross fan. In addition, each first airflow generator 211 may have a first air inlet 2112 connected to the first air outlet 2111. In detail, the first airflow generator 211 can suck the ambient air via the first air inlet 2112 and also can blow it into the reservoir tank 10 via the first air outlet 2111 so as to form an airflow of the aforementioned airflow distribution. However, the disclosure is not limited to the first airflow generator 211 and the type, quantity, and size of the first airflow generator 211. And the disclosure is either not limited to the quantity, location, and size of the first air outlets 2111. In fact, any suitable design or device that can blow airflow via the first air outlets 2111 falls within the scope of the disclosure. For example, in some other embodiments, according to the actual requirements, the quantities or types of the first airflow generators 211 and the first air outlets 2111 can be changed, such as using different types of the first airflow generator 211 or replacing the first airflow generator 211 with other ways of airflow generation, and the disclosure is not limited thereto.

Further, the first air generating assembly 210 is not limited to be stacked on the top surface 11 of the reservoir tank 10. In some other embodiments, the first air generating assembly may be sized to be able to be put into the opening of the reservoir tank; in such a case, the reservoir tank may additionally have one or more through holes for exposing the first air inlet of the first air generating assembly, and the first air generating assembly can be fixed in place on the inner side wall of the reservoir tank by, for example, screwing, welding, or adhesive.

In addition, in this embodiment or some other embodiments, the air generating system 20 may further include a second air generating assembly 220. The second air generating assembly 220 is also located on the reservoir tank 10. Specifically, the second air generating assembly 220 is located between the liquid accommodation space S and the first air generating assembly 210 and is disposed on the inner side wall 12 of the reservoir tank 10 and protrudes inward from the inner side wall 12. The second air generating assembly 220 is configured to suck gas (including the vapor coolant and other internal gas) existing between the first air generating assembly 210 and the liquid accommodation space S and then to blow it toward the liquid accommodation space S. Note that the disclosure is not limited to how the second air generating assembly 220 is fixed to the reservoir tank 10. The second air generating assembly 220 may be additionally disposed on or integrally formed on the reservoir tank 10, and the disclosure is not limited thereto. In the case that the second air generating assembly 220 is additionally disposed on the reservoir tank 10, the second air generating assembly 220 can be fixed to the inner side wall 12 of the reservoir tank 10 by, for example, screwing, welding, or adhesive. Alternatively, in some other embodiments, the second air generating assembly may be sized to be able to be put into the opening of the reservoir tank; in such a case, the second air generating assembly can also be fixed to the inner side wall of the reservoir tank by, for example, screwing, welding, or adhesive.

In addition, as shown in the figure, the second air generating assembly 220 has at least one second air inlet 2211 and at least one second air outlet 2212. The second air inlet 2211 and the second air outlet 2212 are located within the internal space of the reservoir tank 10 and are located above the liquid accommodation space S. In this embodiment, the second air generating assembly 220 has four second air inlets 2211 and four second air outlets 2212, where the second air inlet 2211 and the second air outlet 2212 that are connected to each other are paired.

In this embodiment or some other embodiments, the second air generating assembly 220 can suck the vapor coolant and other internal gas existing between the first air generating assembly 210 and the liquid accommodation space S via the second air inlets 2211; in other words, when the first air generating assembly 210 generates the airflow distribution, the vapor coolant and other internal gas existing between the liquid accommodation space S and the airflow distribution or opening O can be sucked into the second air inlet 2211. The gas existing above the liquid accommodation space S is sucked into the second air inlet 2211, and then the second air generating assembly 220 can blow the gas toward the liquid accommodation space S from the second air outlets 2212. That is, the second air generating assembly 220 is able to transfer and blow the vapor coolant and other internal gas existing between the liquid accommodation space S and the airflow distribution or opening O toward the liquid coolant 8 stored in the liquid accommodation space S.

Since, in this embodiment or some other embodiments, the quantities of the second air inlets 2211 and the second air outlets 2212 are both four, there are four pairs of second air inlets 2211 and second air outlets 2212 respectively located at four sidewalls (not numbered) of the reservoir tank 10; that is, the four pairs of second air inlets 2211 and second air outlets 2212 are respectively located at different sides of the reservoir tank 10.

In addition, the airflow generated from the second air inlets 2211 of the second air generating assembly 220 is not restricted to flowing toward the second air inlets 2211 from the upper and lower areas of the second air generating assembly 220 (e.g., the arrows shown in FIG. 2), it can be altered depending on the actual requirements, and the disclosure is not limited thereto.

For example, in some other embodiments, the second air inlet 2211 can be adjusted to be facing away from the liquid accommodation space S and facing toward the opening O so that airflow will be flowing towards the liquid accommodation space S from the opening O; alternatively, in another embodiment, the second air inlet 2211 may be adjusted to be in an inclined position to face toward the area between the second air generating assembly 220 and the first air generating assembly 210. The above adjustments are implemented depending on the actual requirements. Any suitable design or arrangement of the second air inlet 2211 of the second air generating assembly 220 that is able to suck the gas existing between the first air generating assembly 210 and the liquid accommodation space S falls within the scope of the disclosure.

Further, the airflow generated from the second air outlets 2212 of the second air generating assembly 220 is not restricted to flowing towards the liquid accommodation space S (as the arrows shown in FIG. 2), it can be altered depending on the actual requirements, and the disclosure is not limited thereto. For example, in some other embodiments, the second air outlet 2212 may be in an inclined position to face toward the area between the second air generating assembly 220 and the liquid accommodation space S. The above adjustments can be implemented depending on the actual requirements. Any suitable design or arrangement of the second air outlet 2212 of the second air generating assembly 220 that is able to blow the gas and vapor collected from the second air inlet 2211 toward the liquid accommodation space S falls within the scope of the disclosure.

As such, while the vapor coolant rises from the liquid accommodation space S, the second air generating assembly 220 is able to suck the vapor coolant and transfer it back to the liquid accommodation space S so as to create an internal circulation between the first air generating assembly 210 and the liquid accommodation space S.

Therefore, except for the first air generating assembly 210 can generate the airflow distribution to prevent the vapor coolant from escaping from the opening O, the vapor coolant existing between the liquid accommodation space S and the first air generating assembly 210 can be drawn back to the liquid accommodation space S by the second air generating assembly 220. The second air generating assembly 220 helps to further reduce the amount of the vapor coolant that flows towards the airflow distribution and thus ensuring that the vapor coolant will not escape and can be perfectly preserved.

Furthermore, in this embodiment or some other embodiments, the immersion cooling apparatus 1 may further include a vapor condenser 9. The vapor condenser 9 may be, but not limited to, disposed in the area between the liquid accommodation space S and the opening O. Therefore, the internal circulation, generated by the second air generating assembly 220, between the first air generating assembly 210 and the liquid accommodation space S can repeatedly deliver the vapor coolant toward the vapor condenser 9, such that the vapor coolant in the internal circulation can be repeatedly cooled by the vapor condenser 9, and the vapor coolant not yet passing through the vapor condenser 9 can also be drawn into the internal circulation to have more chances and times to be cooled by the vapor condenser 9. As a result, the vapor coolant is ensured to be cooled by the vapor condenser 9 for multiple times. This helps to reduce the amount of the vapor coolant flowing towards the airflow distribution. However, it is noted that the vapor condenser 9 is optional and exemplary, and the disclosure is not limited to the vapor condenser 9 and the design, quantity, and location of the vapor condenser 9.

The disclosure is not limited to the second air inlets 2211 and the second air outlets 2212 and their quantities and locations, any suitable design or arrangement of the second air inlets 2211 and the second air outlets 2212 that is able to create an internal circulation between the liquid accommodation space S and the first air generating assembly 210 to repeatedly transfer the vapor coolant back to the liquid accommodation space S should fall within the scope of the disclosure. For example, in some other embodiments, the second air generating assembly may only have two second air inlets and two second air outlets; in such a case, there will be two pairs of second air inlet and second air outlet, and they are respectively located at two opposite sides of the reservoir tank; alternatively, in another embodiment, each side of the reservoir tank may have two second air inlets and two second air outlets.

Also, it is noted that the disclosure is not limited to how the second air generating assembly 220 generates airflow. For example, in this embodiment or some other embodiments, the second air generating assembly 220 may include one or more second airflow generators 221, and each of the second airflow generators 221 may be, but not limited to, a cross fan, but the disclosure is not limited to the second airflow generator 221 and the type, quantity, and size of the second airflow generator 221. For example, in some other embodiments, according to the actual requirements, the quantity or type of the second airflow generator 221 can be changed, such as using different types of the second airflow generator 221 or replacing the second airflow generator 221 with other ways of airflow generation, and the disclosure is not limited thereto.

Figure 3:
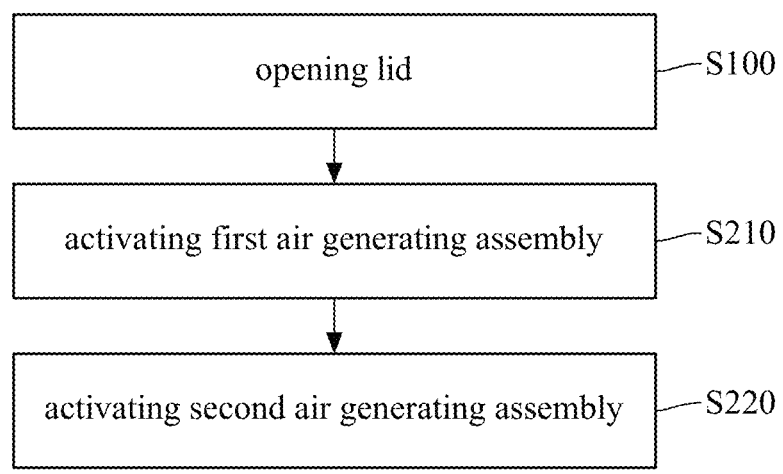
FIG. 3 is a flow chart showing the operation of the immersion cooling apparatus in FIG. 1.

Accordingly, when the lid 30 is required to be opened to replace or install the heat source 7 or do some maintenance works on the heat source 7, the air generating system 20 is able to prevent the vapor coolant from escaping to the external environment. Herein, please refer to FIGS. 1-2 and further refer to FIG. 3, where FIG. 3 is a flow chart showing the operation of the immersion cooling apparatus in FIG. 1.

Firstly, the lid 30 of the immersion cooling apparatus 1 is opened (step S100) so as to expose the opening O of the immersion cooling apparatus 1. At this moment, the liquid accommodation space S of the reservoir tank 10 is also exposed by the opening O.

Then, the air generating system 20 is activated (step S210), the first air generating assembly 210 starts to generate airflow to form an airflow distribution between the opening O and the liquid accommodation space S of the reservoir tank 10 in order to block the vapor coolant evaporated from the liquid coolant 8 in the liquid accommodation space S from passing through the opening O. Meanwhile, the second air generating assembly 220 is activated (step S220) to suck the vapor coolant and other internal gas existing between the first air generating assembly 210 and the liquid accommodation space S and blow them towards the liquid accommodation space S, and thereby creating an internal circulation to repeatedly send the vapor coolant and/or other internal gas existing between the liquid accommodation space S and the first air generating assembly 210 back to the liquid accommodation space S. As a result, the amount of the vapor coolant flowing toward the airflow distribution is considerably reduced.

Figure 4:
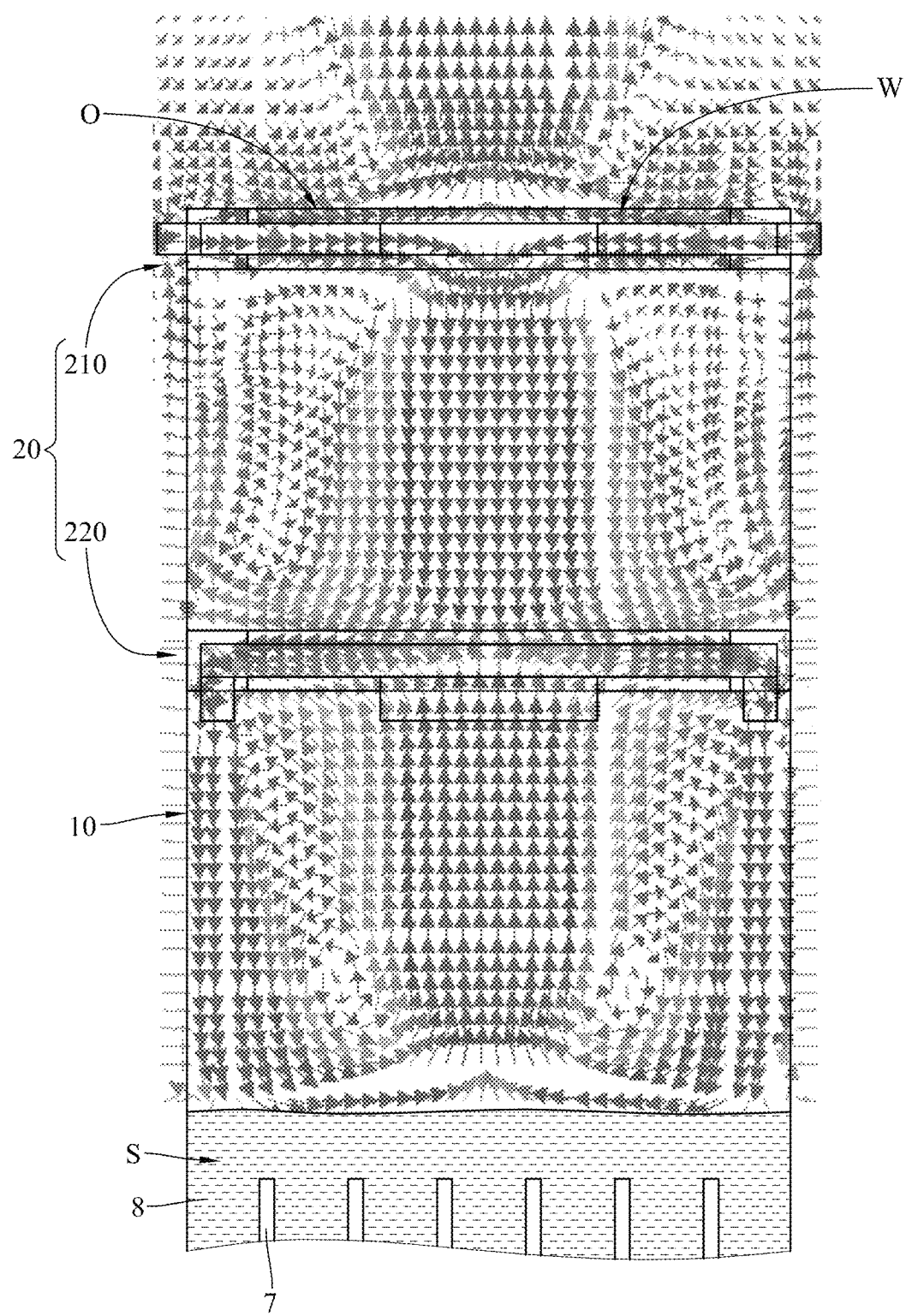
FIG. 4 is a schematic diagram of a flow field simulation of the immersion cooling apparatus in FIG. 1 when the air generating system is in operation.

Herein, please refer to FIG. 4, FIG. 4 is a schematic diagram of a flow field simulation of the immersion cooling apparatus 1 when the air generating system 20 is in operation, where the aforementioned vapor condenser is omitted from FIG. 4 for the purpose of simple and clear illustration, the arrows in FIG. 4 represent the directions of the vapor coolant, and the size of the arrows represent the velocity of the vapor coolant. As shown in the simulation, the vapor coolant evaporated from the liquid accommodation space S rises towards the opening O, the second air generating assembly 220 sucks the vapor coolant existing between the second air generating assembly 220 and the liquid accommodation space S and the vapor coolant existing between the first air generating assembly 210 and the second air generating assembly 220 and then sends them back to the liquid accommodation space S so as to repeatedly cool the vapor coolant. Part of the vapor coolant may flow toward the first air generating assembly 210 and the opening O but will be blocked by the airflow distribution W created by the first air generating assembly 210 and not be able to pass through the opening O. As the internal flow field of the reservoir tank 10 becomes steady, the vapor coolant will be perfectly preserved in the reservoir tank 10 by the airflow distribution W. By that time, only the airflow for forming the airflow distribution W will escape to outside, but it does not affect the performance of the airflow distribution W.

Figure 5A:
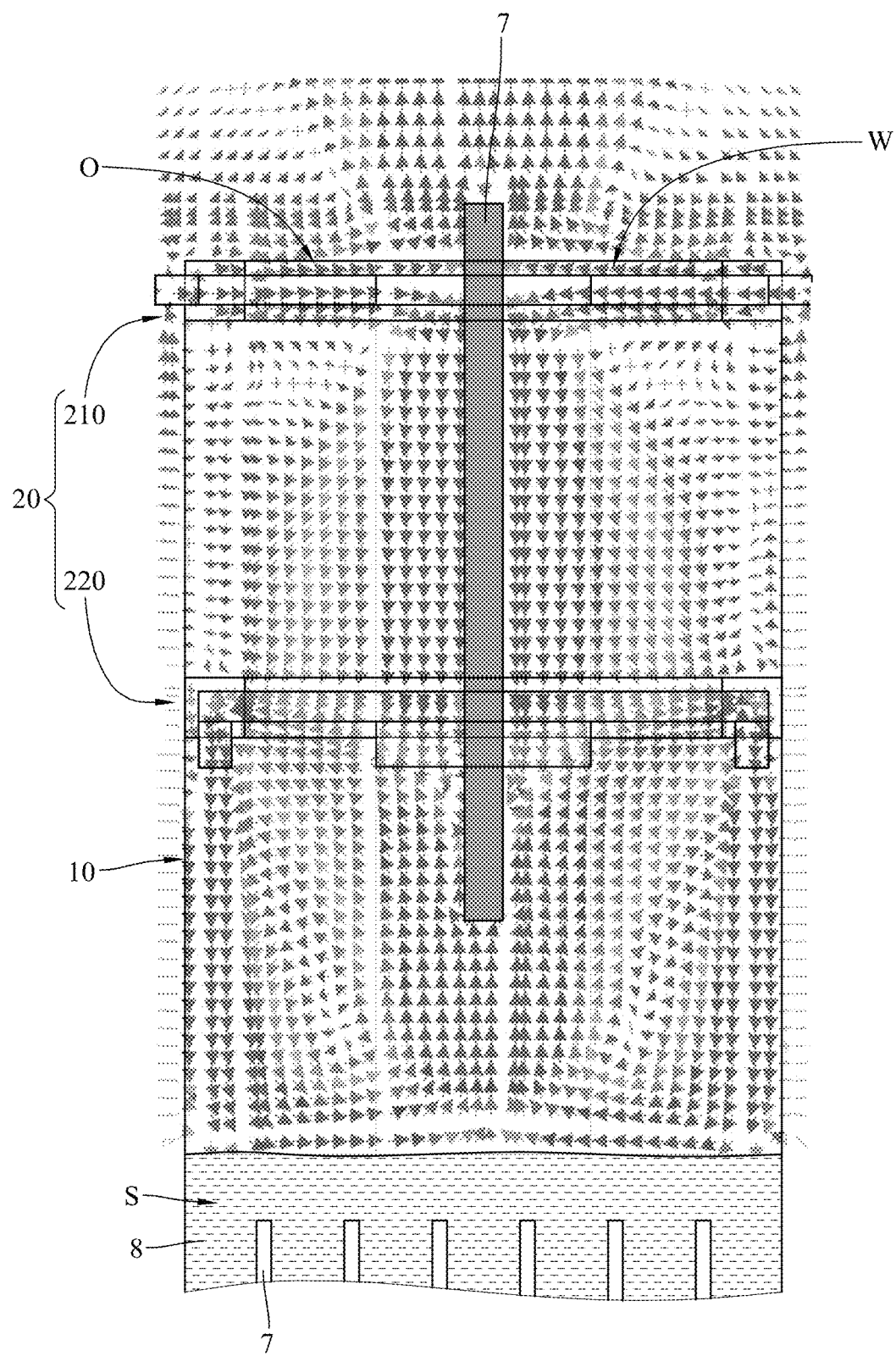
FIG. 5A is a schematic flow field simulation of the immersion cooling apparatus in FIG. 1 when the air generating system is in operation and the reservoir tank contains an object.
Figure 5B:
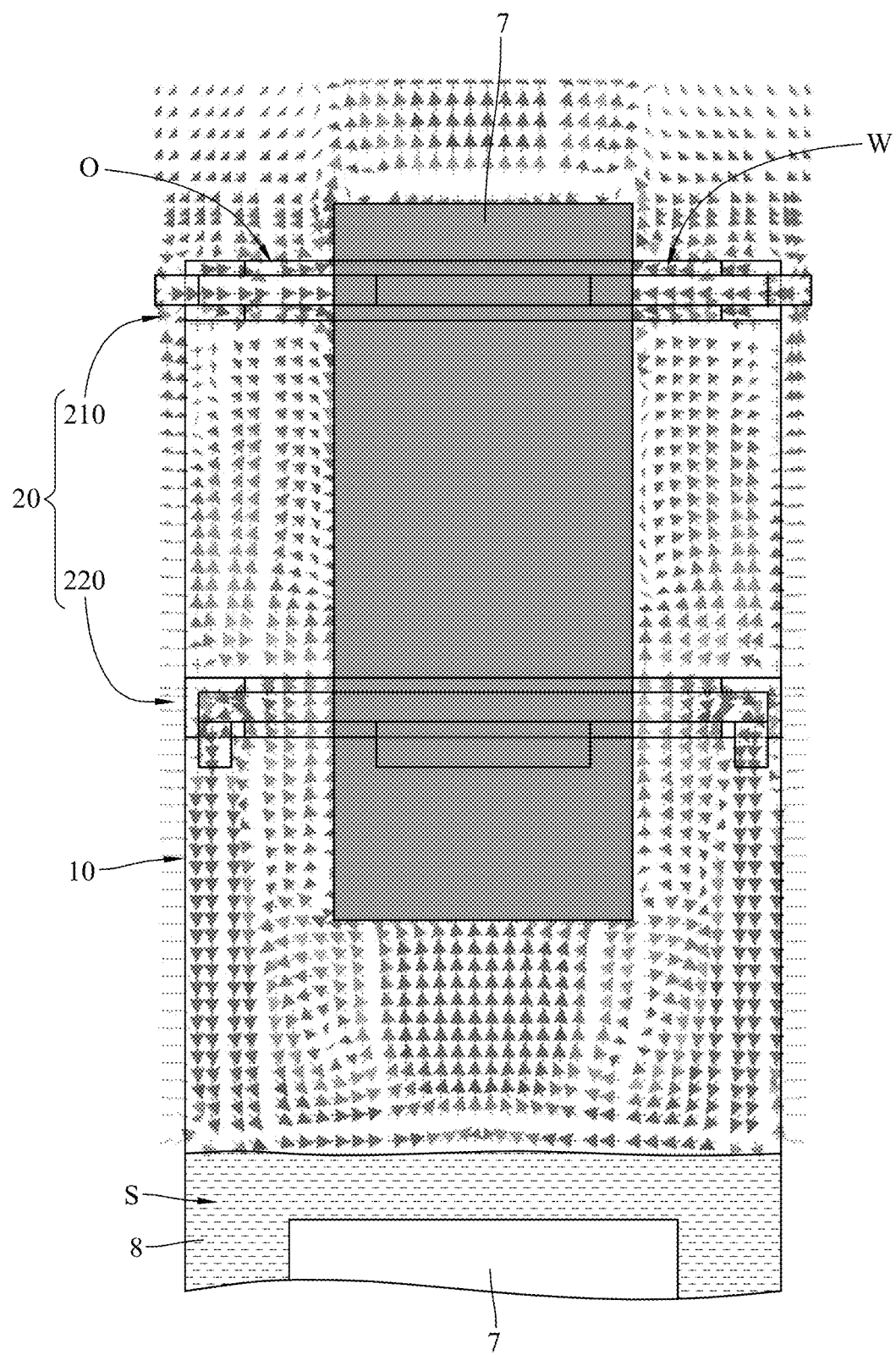
FIG. 5B is a schematic flow field simulation of the immersion cooling apparatus in FIG. 5A, taken from another viewpoint.

Then, please refer to FIGS. 5A-5B, where FIG. 5A is a schematic flow field simulation of the immersion cooling apparatus 1 when the air generating system 20 is in operation and the reservoir tank 10 contains an object (e.g., the heat source 7), and FIG. 5B is the same schematic flow field simulation but taken from a different viewpoint. And for the purpose of simple and clear illustration, the heat source 7 in FIGS. 5A-5B that has been taken out of the liquid accommodation space S is illustrated in a larger size.

One or more of the heat sources 7 can be pulled out of the liquid accommodation space S or installed back in the liquid accommodation space S by using, for example, a robot crane or other mechanical devices (not shown). During the removal or installation of the heat source 7 or other objects from the liquid accommodation space S, the heat source 7 will go through the internal space of the reservoir tank 10. As shown in FIGS. 5A-5B, although the heat source 7 penetrates through the airflow distribution W and occupies part of the internal space of the reservoir tank 10, the second air generating assembly 220 is still able to constantly and perfectly drawing the vapor coolant into the internal circulation to repeatedly cool the vapor coolant, and the airflow distribution W created by the first air generating assembly 210 is still able to suppress the rising vapor coolant. This proves that the air generating system 20 is still able to prevent the internal gas, such as vapor or gaseous coolant or other internal gaseous or vapor substances, from escaping from the reservoir tank 10 even while an object is passing through the opening O of the reservoir tank 10. It is noted that the disclosure is not limited to the aforementioned object and the size and shape of the object.

Further, it is also noted that, according to the actual requirements, the steps S100-S220 can be performed in any order. For example, in one embodiment, the first air generating assembly 210 can be activated to create the airflow distribution W (step S210) before opening the lid 30 (step S100), that is, the step S210 can be performed before the step S100; alternatively, both the first air generating assembly 210 and the second air generating assembly 220 can be activated to create the airflow distribution W and the internal circulation (steps S210 and step S220) before opening the lid 30 (step S100), that is, the steps S210 and S220 can be performed before the step S100. In the embodiment that the immersion cooling apparatus does not have the lid 30, the step S100 is omitted; in such a case, the air generating system can be constantly in operation to prevent the vapor coolant from escaping.

Further, the disclosure is either not limited to the structural proportion of the immersion cooling apparatus. For example, in some other embodiments, the first air generating assembly 210 may be spaced apart from the top side 101 of the reservoir tank 10; that is, the first air generating assembly 210 may be adjusted to a location that is not at the opening O and is much closer to the liquid accommodation space S, and such modification does not affect the performance of the airflow distribution. Alternatively, in another embodiment, the distances among the first air generating assembly 210, the second air generating assembly 220 and the liquid accommodation space S all can be altered according to the actual requirements, and the disclosure is not limited thereto. Based on the foregoing embodiments, implementing the above modifications or changes should be obvious to those having ordinary skill in the art, and thus will not be described in detail.

Figure 6:
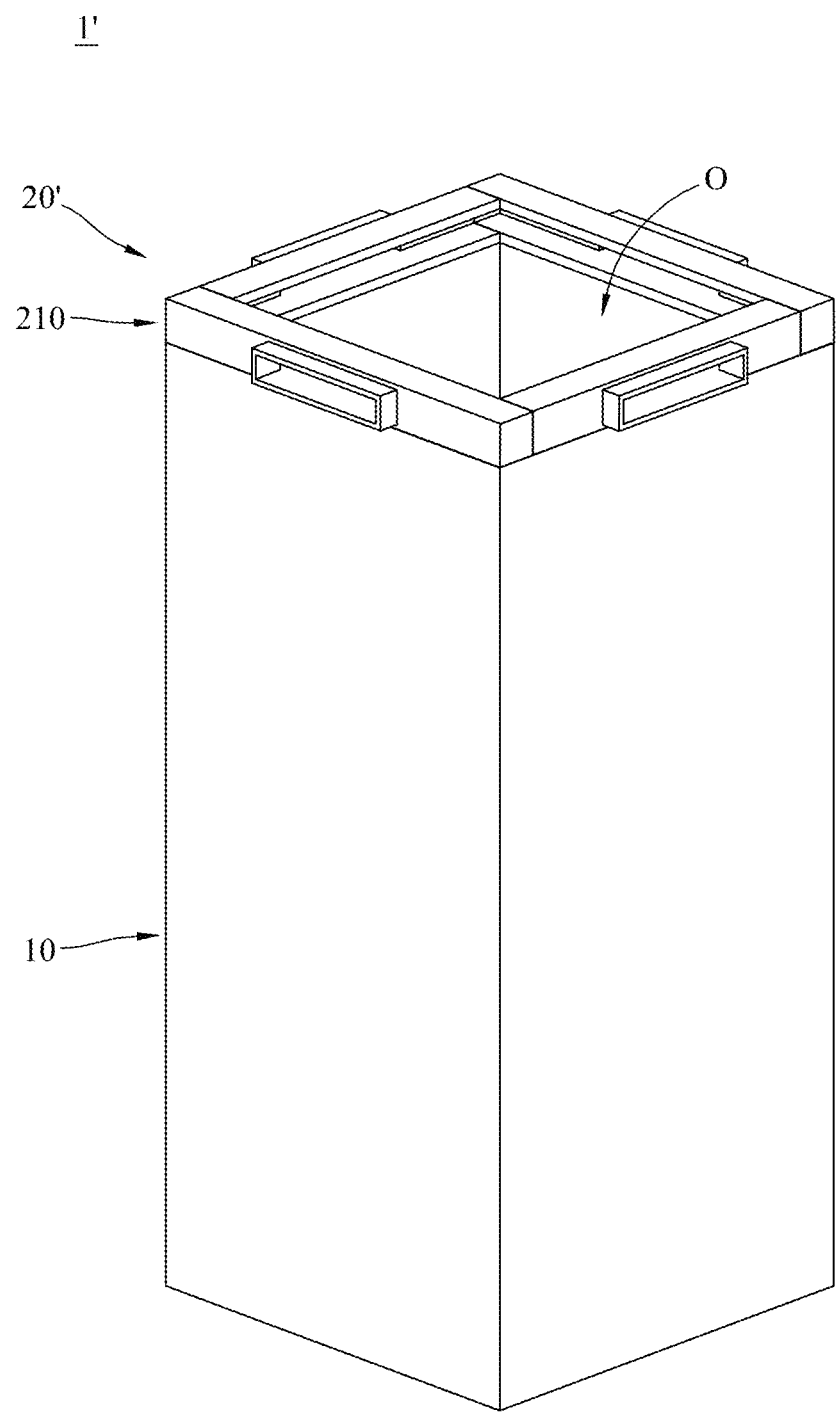
FIG. 6 is a perspective view of an immersion cooling apparatus according to another embodiment of the disclosure.

In addition, the foregoing embodiments are exemplary, and the disclosure is not limited thereto. For example, in some other embodiments, the immersion cooling apparatus may not have the second air generating assembly 220. For example, please refer to FIG. 6, FIG. 6 is a perspective view of an immersion cooling apparatus 1' according to another embodiment of the disclosure.

The main differences between the immersion cooling apparatus 1' and the immersion cooling apparatus 1 is that an air generating system 20' of the immersion cooling apparatus 1' only includes the first air generating assembly 210. As discussed in foregoing embodiments, the first air generating assembly 210 can create an airflow distribution for blocking the vapor coolant in the reservoir tank 10 from passing through the opening O, it is understood that the air generating system 20' of the immersion cooling apparatus 1' is able to prevent the vapor coolant from escaping from the reservoir tank 10 whether the opening O is exposed or an object is passing through the opening O.

The immersion cooling apparatus is merely one of the applications of the disclosure. In another embodiment, the aforementioned air generating system may be applied to other types of cooling apparatus that has a reservoir tank and it still able to create an airflow distribution between the liquid accommodation space and opening of the reservoir tank, and any suitable application should fall within the scope of the disclosure.

In addition, in the above embodiments, the air generating system may be integrally formed on the reservoir tank, but the disclosure is not limited thereto. For example, in another embodiment, the air generating system may be detachably disposed on any reservoir tank and thus having a wide applicability.

According to the air generating system for reservoir tank, the immersion cooling apparatus having the same and the method for operating the same discussed above, the first air generating assembly is able to create an airflow distribution at the opening of the reservoir tank or between the opening and the liquid accommodation space of the reservoir tank, such that the vaporized coolant in the reservoir tank is prevented from escaping from the opening of the reservoir tank.

Further, in some embodiments, the air generating system further has a second air generating assembly on the reservoir tank for sucking vapor substance above the liquid accommodation space and send it back to the liquid accommodation space, thereby repeatedly delivering the vapor coolant to the vapor condenser; that is, the vapor coolant in the internal circulation can be repeatedly cooled by the vapor condenser, and the vapor coolant not yet passing through the vapor condenser can also be drawn into the internal circulation to have more chances and times to be cooled by the vapor condenser.

In addition, whether an object, such as a mainboard or other heat source, is passing through the opening of the reservoir tank or being put into the liquid accommodation space, the airflow distribution created by the first air generating assembly of the air generating system all can suppress and prevent the rising vapor coolant from escaping to the external environment.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An air generating system adapted for a reservoir tank, the air generating system comprising:
a first air generating assembly, configured to be disposed on the reservoir tank and wherein the first air generating assembly has at least one first air outlet and at least one first air inlet that are connected to the each other to generate an air barrier to stop internal gas in the reservoir tank from passing through an opening of the reservoir tank, wherein the air barrier is a barrier made of air.

2. The air generating system according to claim 1, wherein the reservoir tank has a top surface surrounding the opening of the reservoir tank, and the first air generating assembly is disposed on the top surface.

3. The air generating system according to claim 1, wherein the first air generating assembly is configured to suck vapor substance via the at least one first air inlet and generate the air barrier via the at least one first air outlet.

4. The air generating system according to claim 1, further comprising a second air generating assembly, the second air generating assembly configured to be disposed on the reservoir tank, the first air generating assembly is located between the second air generating assembly and an opening of the reservoir tank, wherein the second air generating assembly has at least one second air inlet and at least one second air outlet connected to each other, the second air generating assembly is configured to suck internal vapor substance via the at least one second air inlet and to blow the internal vapor substance inwards via the at least one second air outlet.

5. The air generating system according to claim 4, wherein the second air generating assembly is disposed on an inner side wall of the reservoir tank.

6. An immersion cooling apparatus, comprising:
a reservoir tank; and
a first air generating assembly, located on the reservoir tank, wherein the first air generating assembly has at least one first air outlet and at least one first air inlet that are connected to the each other and is configured to generate an air barrier to stop internal gas in the reservoir tank from passing through an opening of the reservoir tank and wherein the air barrier is a barrier made of air.

7. The immersion cooling apparatus according to claim 6, wherein the first air generating assembly is configured to suck vapor substance via the at least one first air inlet and to generate the air barrier via the at least one first air outlet.

8. The immersion cooling apparatus according to claim 7, wherein a quantity of the at least one first air outlet of the first air generating assembly is two, and the two first air outlets are respectively located at two opposite sides of the reservoir tank.

9. The immersion cooling apparatus according to claim 8, wherein the reservoir tank has a bottom side opposite the opening of the reservoir tank, and distances from the bottom side to each of the two first air outlets are the same.

10. The immersion cooling apparatus according to claim 8, wherein the two first air outlets are configured to generate airflow flowing towards each other.

11. The immersion cooling apparatus according to claim 6, wherein the first air generating assembly is configured to suck vapor substance via the at least one first air inlet and to generate the air barrier via the at least one first air outlet, a quantity of the at least one first air outlet is plural, the first air outlets are respectively located on different sides of the reservoir tank.

12. The immersion cooling apparatus according to claim 6, further comprising a second air generating assembly, the second air generating assembly located on the reservoir tank, the first air generating assembly is located between the opening of the reservoir tank and the second air generating assembly, wherein the second air generating assembly has at least one second air inlet and at least one second air outlet that are connected to each other, wherein the second air generating assembly is configured to suck internal vapor substance via the at least one second air inlet and to blow the internal substance inwards via the at least one second air outlet.

13. The immersion cooling apparatus according to claim 12, wherein quantities of the at least one second air inlet and the at least one second air outlet are plural, and the second air inlets and the second air outlets are located at different sides of the reservoir tank.

14. The immersion cooling apparatus according to claim 12, further comprising a vapor condenser, located in the reservoir tank and corresponding to the second air generating assembly.

15. The immersion cooling apparatus according to claim 6, further comprising a lid, the lid movably disposed on the reservoir tank and configured to open or close the opening of the reservoir tank, wherein the opening is located between the first air generating assembly and the lid.

16. An immersion cooling apparatus, comprising:
- a reservoir tank, wherein the reservoir tank contains a condenser; and
- a first air generating assembly, located on the reservoir tank, wherein the first air generating assembly has at least one first air outlet and at least one first air inlet that are connected to the each other and is configured to generate an air barrier at an internal area of the reservoir tank which is absent of the condenser and wherein the air barrier is a barrier made of air.

* * * * *